(12) United States Patent
Murukumpet et al.

(10) Patent No.: US 10,775,820 B2
(45) Date of Patent: Sep. 15, 2020

(54) ON CHIP NMOS GAPLESS LDO FOR HIGH SPEED MICROCONTROLLERS

(71) Applicant: Microchip Technology Incorporated, Chandler, AZ (US)

(72) Inventors: Raghuveer Murukumpet, Bangalore (IN); James Bartling, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/782,145

(22) Filed: Oct. 12, 2017

(65) Prior Publication Data

US 2019/0113942 A1 Apr. 18, 2019

(51) Int. Cl.
| | |
|---|---|
| G05F 1/575 | (2006.01) |
| G05F 1/565 | (2006.01) |
| G05F 1/46 | (2006.01) |
| H03F 1/02 | (2006.01) |
| H03F 3/45 | (2006.01) |

(52) U.S. Cl.
CPC .............. G05F 1/575 (2013.01); G05F 1/461 (2013.01); G05F 1/565 (2013.01); H03F 1/0211 (2013.01); H03F 3/45179 (2013.01)

(58) Field of Classification Search
CPC ... G05F 1/10; G05F 1/46; G05F 1/461; G05F 1/462; G05F 1/467; G05F 1/468; G05F 1/56; G05F 1/562; G05F 1/563; G05F 1/565; G05F 1/569; G05F 1/571; G05F 1/573; G05F 1/5735; G05F 1/575; G05F 1/59; H03F 1/0211; H03F 3/45; H03F 3/45071; H03F 3/45076; H03F 3/45179; H02M 3/156; H02M 3/158; H02M 3/1588; H02M 2001/0025; H02M 2001/0032; H02M 2001/0045; H02M 2003/1566; H02M 2001/0003; H02M 2001/0006; H02M 2001/0016; H02M 2001/0019; H02M 2001/0029; H02M 1/08;
(Continued)

(56) References Cited

U.S. PATENT DOCUMENTS 6,043,702 A * 3/2000 Singh ............... H03K 19/00315
326/27
6,373,754 B1 * 4/2002 Bae ........................ G11C 5/147
327/540
(Continued)

OTHER PUBLICATIONS

International Search Report and Written Opinion, Application No. PCT/US2018/055143, 13 pages, dated Jan. 22, 2019.

*Primary Examiner* — Thienvu V Tran
*Assistant Examiner* — Carlos O Rivera-Perez
(74) *Attorney, Agent, or Firm* — Slayden Grubert Beard PLLC

(57) ABSTRACT

A voltage regulator includes an error amplifier configured to amplify a difference between a feedback voltage and a reference voltage. The regulator also includes an N-type metal-oxide-semiconductor (NMOS) driver circuit. The driver circuit includes an n-type field effect transistor. The driver circuit is communicatively coupled to output of the error amplifier. The regulator further includes a feedback circuit communicatively coupled between the NMOS driver circuit and an input of the error amplifier to provide the feedback voltage.

21 Claims, 10 Drawing Sheets

(58) Field of Classification Search
CPC ........ H02M 1/082; H02M 1/14; H02M 1/143; H02M 1/15
USPC ................ 323/222–226, 268–276, 280–286, 323/311–313, 351, 908; 327/309, 310, 327/312, 317, 534–543
See application file for complete search history.

(56) References Cited

U.S. PATENT DOCUMENTS

| | | | |
|---|---|---|---|
| 9,471,078 | B1 | 10/2016 | Guan et al. |
| 9,778,667 | B2* | 10/2017 | Peluso ................ G05F 1/56 |
| 2006/0012354 | A1 | 1/2006 | Nunokawa et al. .......... 323/273 |
| 2008/0180071 | A1* | 7/2008 | Moraveji ................ G05F 1/575 323/268 |
| 2010/0156364 | A1 | 6/2010 | Cho et al. .................... 323/280 |
| 2016/0026196 | A1* | 1/2016 | Mnich .................... G05F 1/468 323/281 |
| 2016/0291619 | A1* | 10/2016 | Guan .................... G05F 1/575 |

\* cited by examiner

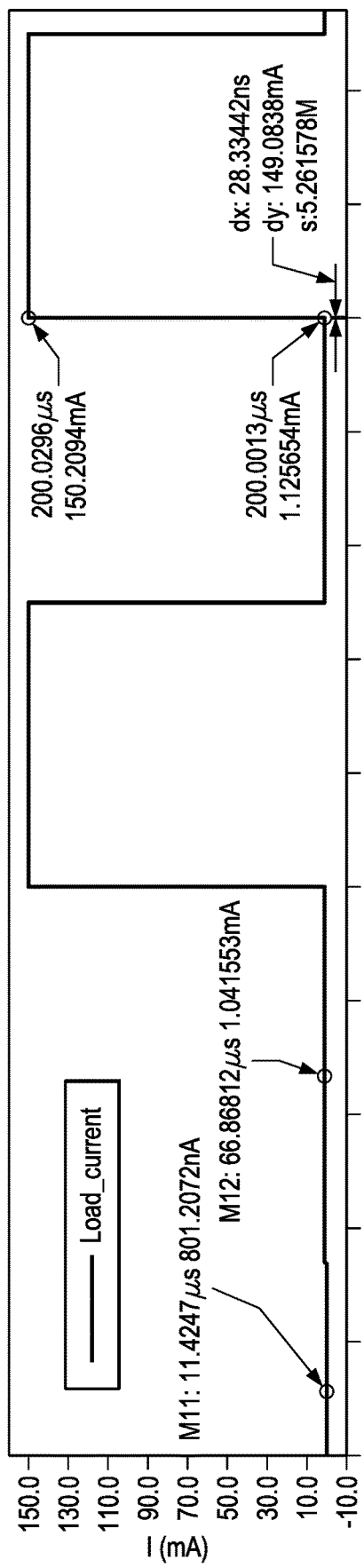
FIG. 7
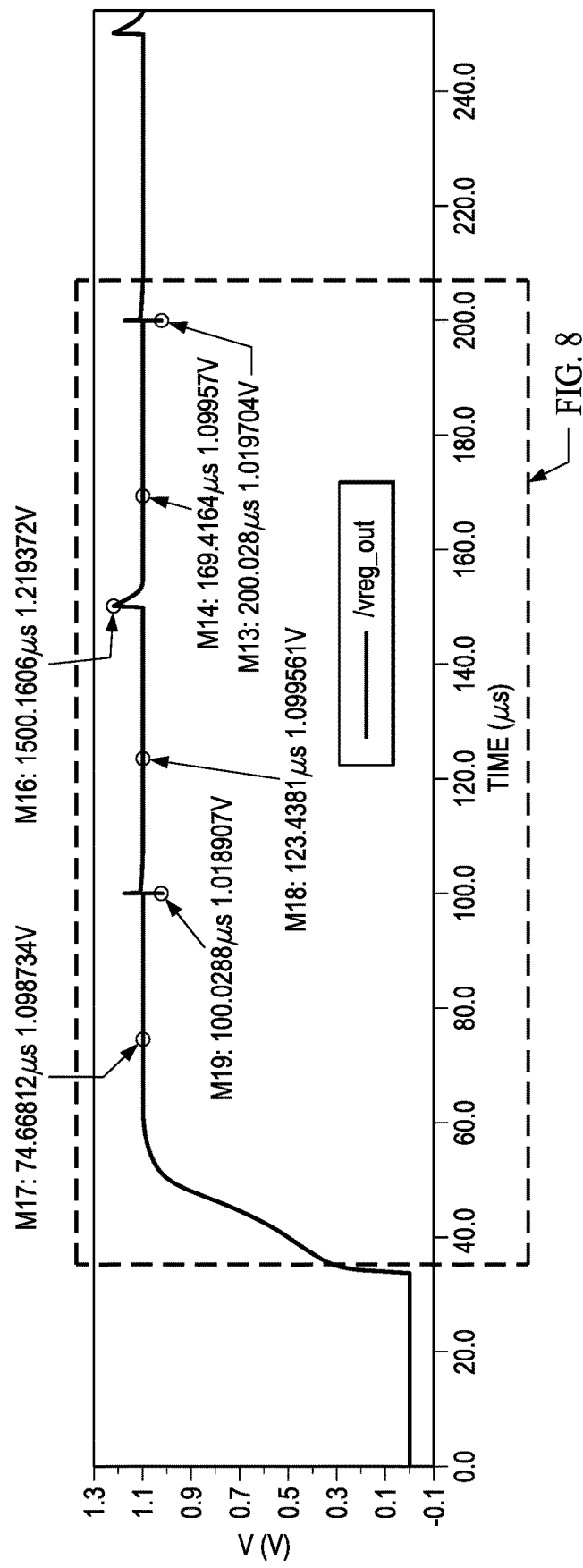

ON CHIP NMOS GAPLESS LDO FOR HIGH SPEED MICROCONTROLLERS

TECHNICAL FIELD

The present disclosure relates to voltage regulation and, more particularly, to an on-chip capacitor-less low-dropout (LDO) voltage regulator.

DESCRIPTION OF THE RELATED ART

An LDO may include a direct current (DC) linear voltage regulator that can regulate output voltage even when the supply voltage and the output are nearly the same. LDOs are used to avoid switching. LDOs dissipate power in order to regulate the output voltage. LDOs may be implemented with a power field-effect transistor (FET). Moreover, LDOs may be implemented with a differential amplifier to amplify the error. An input of the differential amplifier may monitor the fraction of the output determined by a resistor ratio. An LDO may include an input from a known, stable voltage reference. LDOs may operate by driving their transistors to saturation. The voltage drop from unregulated voltage to the regulated voltage can be as low as the saturation voltage across the transistor. Power FETs or bipolar transistors may be used in the LDO.

One characteristic of an LDO is its quiescent current. This current may account for the difference between the input and output current of the LDO. This current may be drawn by the LDO in order to control its internal circuitry for proper operation.

The transient response of an LDO is the maximum allowable output voltage variation for a step change in load current. The response may be a function of output capacitance, equivalent series resistance of such capacitance, the bypass capacitor, and maximum load-current.

Applications of LDOs may include voltage, current and temperature monitoring, diagnostic information gathering. LDOs may be controlled with programmable current limits, active output discharges, or control of power supplies related to the LDO.

BRIEF DESCRIPTION OF THE FIGURES

FIGS. 7-10 show transient response, performance, and other characteristics of the regulator, according to embodiments of the present disclosure.

SUMMARY

Figure 1:
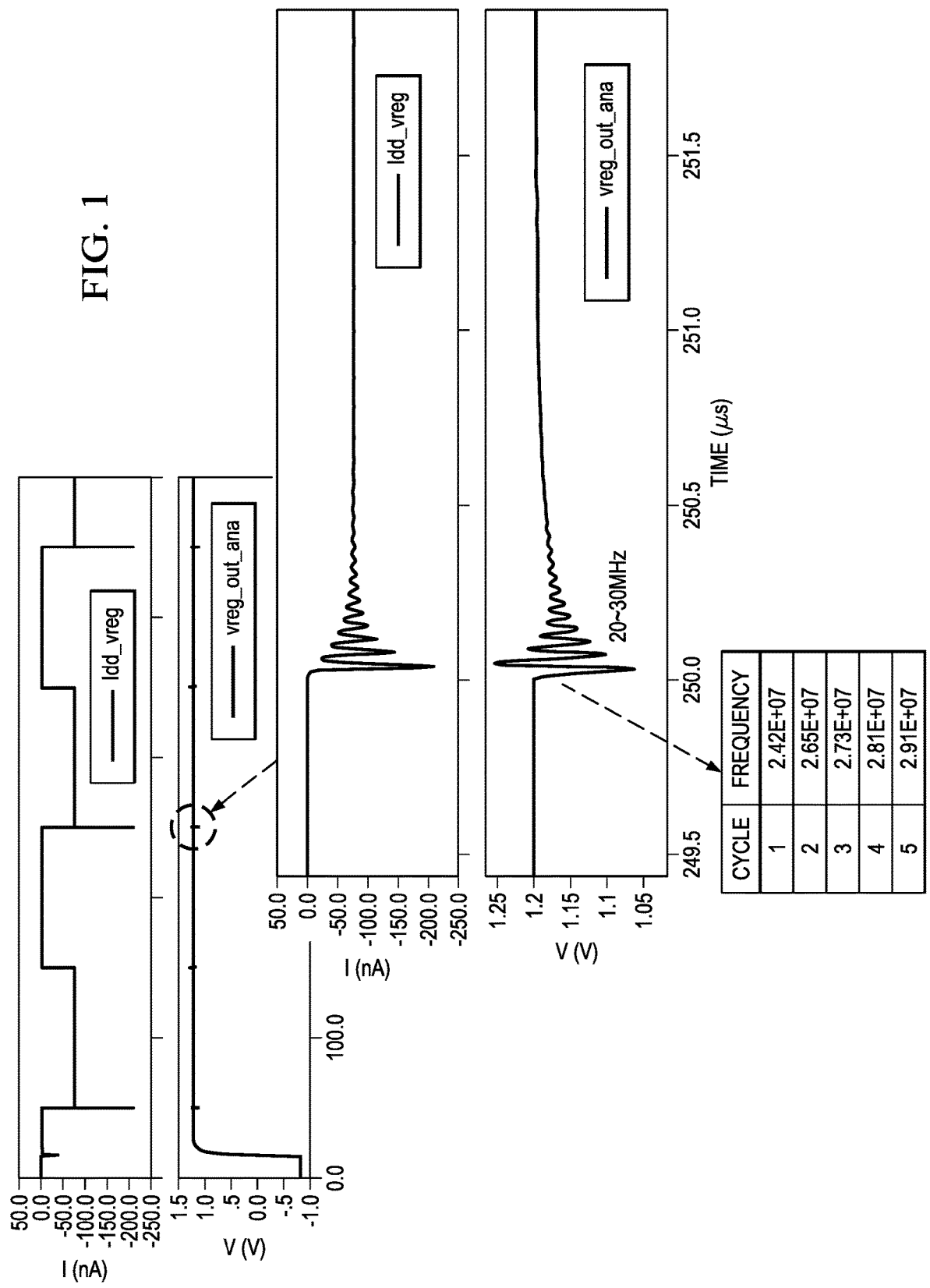
FIG. 1 is an illustration of a transient load change from 1 milliamp to 75 milliamps over a period of 30 nanoseconds with a decap value of 6 nanoFarads.

Embodiments of the present disclosure may include a voltage regulator. The voltage regulator may include an error amplifier configured to amplify a difference between a feedback voltage and a reference voltage. The voltage regulator may include an NMOS driver circuit. The NMOS driver circuit may include an-type field effect transistor, communicatively coupled to output of the error amplifier. The voltage regulator may include a feedback circuit communicatively coupled between the NMOS driver circuit and an input of the error amplifier to provide the feedback voltage. In combination with any of the above embodiments, the voltage regulator may include a pump circuit configured to pump current into a gate node of the NMOS driver circuit upon a transient voltage drop at an output of the NMOS driver circuit. In combination with any of the above embodiments, the voltage regulator may include a discharge circuit configured to discharge a gate node of the NMOS driver circuit upon a transient voltage overshoot at an output of the NMOS driver circuit. In combination with any of the above embodiments, the voltage regulator may include a load connected to output of the NMOS driver circuit, the output of the NMOS driver circuit configured to provide power to the load, wherein the connection between the output of the NMOS driver circuit and the load is capacitor-less. In combination with any of the above embodiments, the voltage regulator may include a first buffer circuit communicatively coupled to output of the NMOS driver circuit and configured to signal to a discharge circuit configured to discharge a gate node of the NMOS driver circuit upon a transient voltage overshoot. In combination with any of the above embodiments, the first buffer circuit includes a plurality of inverters with a trip voltage corresponding to the transient voltage overshoot. In combination with any of the above embodiments, the voltage regulator may include a second buffer circuit communicatively coupled to output of the NMOS driver circuit and configured to signal to a pump circuit configured to pump current into a gate node of the NMOS driver circuit upon a transient voltage drop. In combination with any of the above embodiments, the second buffer circuit may include a plurality of inverters. In combination with any of the above embodiments, the voltage regulator may include a pump circuit configured to pump current into a gate node of the NMOS driver circuit, wherein an amount of the current is based upon a size of a voltage spike on an output of the NMOS driver circuit. In combination with any of the above embodiments, the voltage regulator may include a pump circuit configured to pump increased current into a gate node of the NMOS driver circuit based upon an increased load applied to an output of the NMOS driver circuit. In combination with any of the above embodiments, the voltage regulator may include a differential circuit configured to compare output of the NMOS driver circuit against another reference voltage. In combination with any of the above embodiments, the other reference voltage is the same as the first reference voltage. In combination with any of the above embodiments, the differential circuit is communicatively coupled to the pump circuit. In combination with any of the above embodiments, the differential circuit is coupled to the pump circuit through the second buffer. In combination with any of the above embodiments, the differential circuit is coupled to the discharge circuit. In combination with any of the above embodiments, the differential circuit is coupled to the discharge circuit through the first buffer.

Embodiments of the present disclosure may include microcontrollers, processors, semiconductor devices, chips, or systems that include any combination of the voltage converters above.

Embodiments of the present disclosure may include methods performed by any of the microcontrollers, processors, semiconductor devices, chips, systems, or voltage converters above.

DETAILED DESCRIPTION

Embodiments of the present disclosure may be directed to on-chip LDO voltage regulators. Such regulators may be capacitor-less with respect to internal capacitors. Such regulators may be used, for example, in high-speed microcontrollers. Such regulators may be based upon transistors such as NMOS transistors.

Embodiments of the present disclosure may solve problems associated with PMOS capless LDOs with respect to power wasted. Furthermore, embodiments of the present disclosure may solve problems associated with designing a capless LDO for fast transient responses with average currents at approximately 150 milliamps.

Embodiments of the present disclosure include a capless LDO that is stable when load capacitors with capacitances from 0 to 30 nF are used. Such stability may be performed even with zero current load conditions and with superior load transient response.

Embodiments of the present disclosure may include circuits with a fast differentiator circuit with two non-overlapping anti-phase clocking chains. These may respond mutually exclusive to transient changes in regulator output.

FIG. 1 is an illustration of a transient load change from 1 milliamp to 75 milliamps over a period of 30 nanoseconds with a decap value of 6 nanoFarads. This may be produced using an existing PMOS capless LDO. As shown, this may cause instability due to poor architecture.

Figure 2:
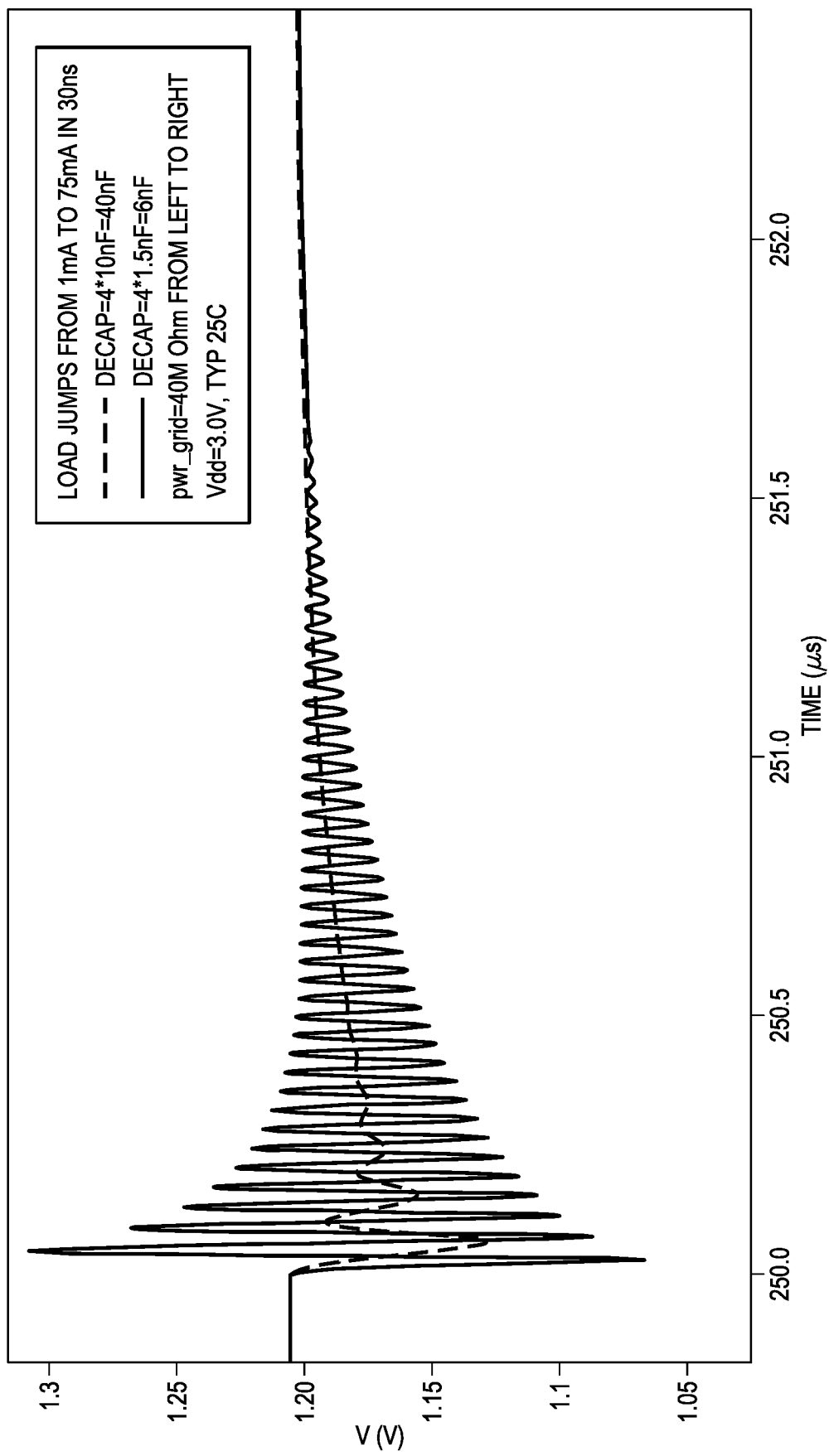
FIG. 2 provides a more detailed view of the instability shown in FIG. 1.

FIG. 2 provides a more detailed view of such instability. The red trace may be the trace starting before the more variable blue trace.

Figure 3:
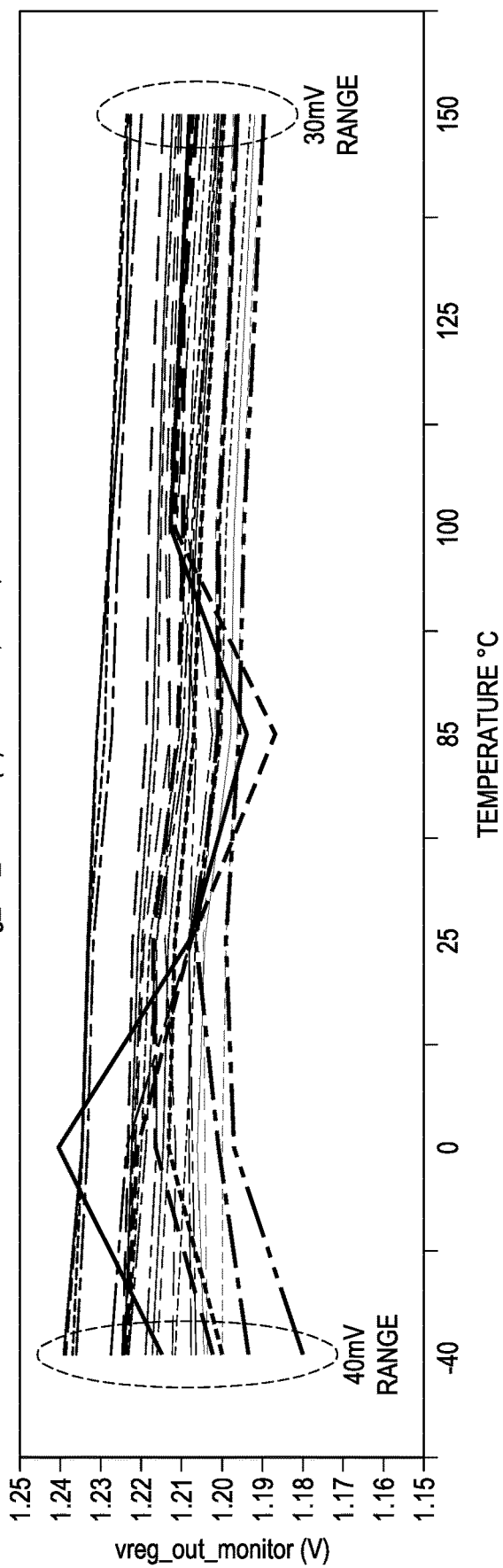
FIG. 3 illustrates additional information regarding such instability, charting the movement of regulator voltage between a 30 mV range and a 40 mV range over varying temperatures.

FIG. 3 illustrates additional information regarding such instability, charting the movement of regulator voltage between a 30 mV range and a 40 mV range over varying temperatures. Different plots in FIG. 3 represent different Vdd values and loads. Vdd values may include 1.98 V, 2.6 V, 3.3 V, or 3.65V. Temperatures may include –40° C., 0° C., 25° C., 85° C., 100° C., 125° C., or 150° C. Loads may include 1 mA, 50 mA, or 75 mA.

Figure 4:
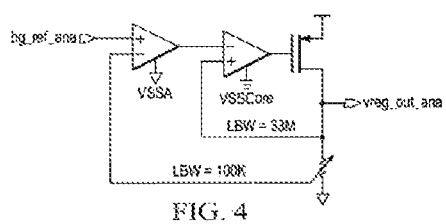
FIG. 4 illustrates an example architecture of a PMOS-driver capless LDO that may cause instability in output.

FIG. 4 illustrates an example architecture of a PMOS-driver capless LDO that may cause such instability in output.

Figure 5:
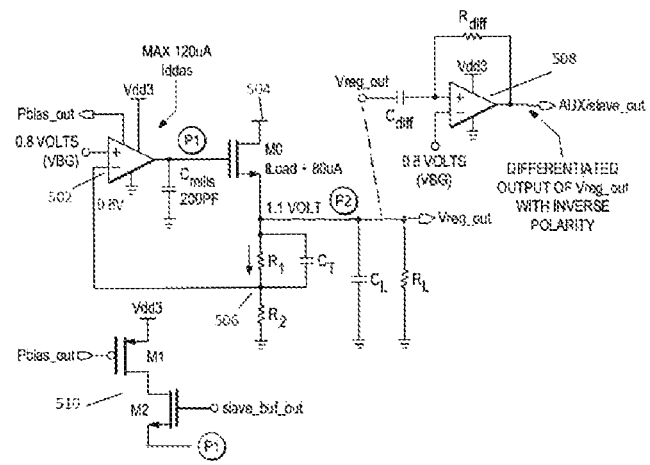
FIGS. 5 and 6 illustrate an example regulator, according to embodiments of the present disclosure.
Figure 6:
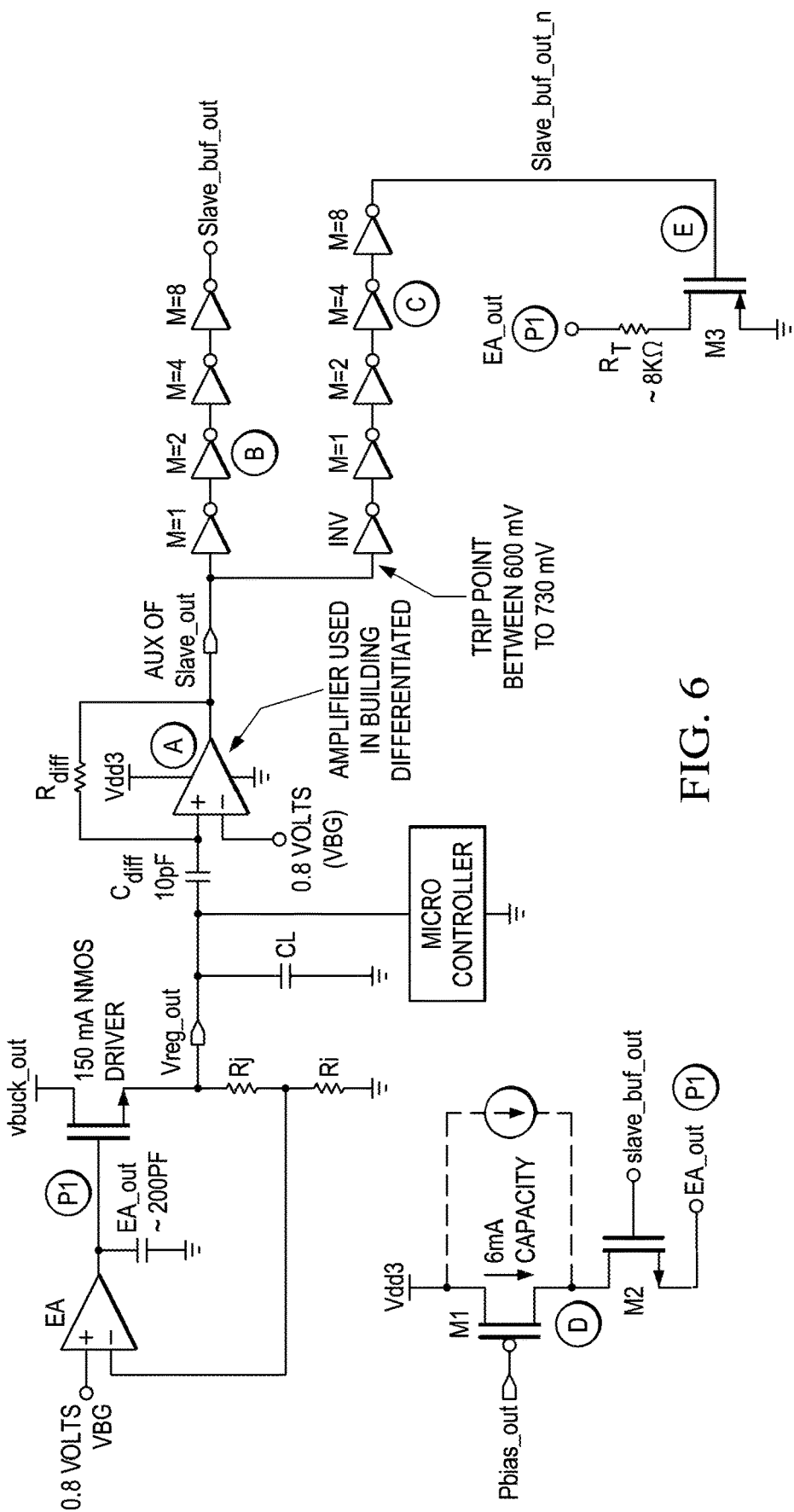

FIGS. 5 and 6 illustrate an example regulator, according to embodiments of the present disclosure. Such a regulator may be contrasted with the PMOS-driver LDO. The regulator of FIGS. 5 and 6 may incorporate an NMOS driver transistor. The transistor may use a 1.3 V output from a buck regulator to generate a VDD core of 1.1 V. A differentiator followed by two inverter chains, along with switcher circuits, may form the fast-transient response system needed for preventing large voltage drops and overshoots during normal operation of microcontrollers. FIGS. 5 and 6 illustrate example embodiments of a regulator. The regulator may include components P1, A, B, C, D, and E as labeled in FIGS. 5 and 6.

FIG. 5 depicts the LDO which includes the error amplifier (folded cascode) 502, output NMOS driver 504 (M0), resistive divider 506 for feedback, differentiator 508 for fast transient response along with the 2-transistor circuit 510 including M1 & M2.

Error amplifier 502 may include as a current bias an input from pbias_out, the output of 2-transistor circuit 510. Error amplifier 502 may amplify the difference between a known voltage, such as Vbg (which may be 0.8V) and a feedback voltage from resistive divider 506. Error amplifier 502 may be powered by Vdd3 and grounded for its own power supply. Vdd3 may be in a range of, for example, 2.7V to 3.7V or 1.3V to 1.5V. The current of error amplifier 502 with respect to Vdd3 may be Idd3 and might be a maximum of 120 microamps. The output of error amplifier 502 might be connected to a capacitor Cmiller connected in turn to ground. This capacitor might be eliminated in embodiments of the present disclosure. The value may be 200 picoFarads. The output may be referenced as P1. The output may be fed into output NMOS driver 504.

P1 may be fed into a gate of a transistor of driver 504. The base or source may be connected to a voltage of a buck regulator or Vbuck. This may be set at 1.3V to 1.5V. The emitter may resut in 1.1V. The emitter may connected to node referenced as P2. P2 may also be referenced as Vreg_out and might be the output of voltage regulation. P2 may be connected to ground in parallel to network 506, a load capacitor C1 of 0-20 nanoFarads that may be omitted, and to a load resistor R1 as low as 7 ohms. The total output current might be less than 500 microamps.

Network 506 may include R1 and R2 in series, with a capacitor Ct in parallel with R1. The current entering network 506 may be 80 microamps. A feedback signal may be sent to the negative terminal of error amplifier 502 from the junction of Ct, R1, and R2. The voltage at the negative terminal may be approximately 0.8V. Ct may be a load compensation, fast transient response capacitor and have a value of 10 picoFarads.

Circuit 510 may include Vdd3 connected to the source of a first transistor, M1, whose emitter is connected to a source of a second transistor M2. The gate of M2 may be connected through buffers to an aux signal and the emitter of M2 may be connected to P1. The gate of M1 may be connected to Pbias_out. The connection may be through an internal node of error amplifier 502.

M2 may have a built-in feedback as it acts as a source follower rather than a switch. The magnitude of the aux signal may depend upon on the load transient. For a light load transient, the voltage spike on aux signal might be small. Hence, M1 may source less current to node P1. P1 may have a 200 pF capacitor connected. For heavy load transients, aux signal may have a large amplitude. This may result in higher current flow from M1 to P1.

Circuit 510 may pump current into the gate of the NMOS driver through error amplifier 502. This may be performed whenever a transient voltage drop is sensed at Vreg_out. The capacity of current through M1 may be 6 microamps.

Differentiator 508 may be an amplifier used in building differentials for tripping points, discussed further below. Differentiator 508 may include a connection to Vreg_out as an input. Differentiator 508 may include a capacitor, Cdiff, connected between Vreg_out and a negative terminal of an op-amp. The capacitance of Cuff may be 10 picoFarads. A resistor feedback loop may be connected between an output of the op-amp and the negative terminal of the op-amp. The resistor feedback loop may include a resistor, Rdiff, with a value of 100 kiloohms. The op-amp may be powered by Vdd3 and grounded. The output may be the aux signal which, after passing through a buffer chain, may be applied to circuit 510. A constant voltage, such as Vbg or 0.8 V, may be connected to the positive terminal of the op-amp. The current flowing in the resistor feedback loop may be 150 microamps. The differential output, as the aux signal, may thus be a differentiated output of Vreg_out with inverse polarity.

FIG. 6 depicts A, B, C, D & E mentioned below. Differentiator 508 may be referenced as (A) with respect to FIG. 6. Circuit 510 may be referenced as (D).

The output of Vreg_out may be provided to other parts of a system in which the LDO resides, such as a microcontroller. The Vreg_out may be provided to a digital core of such a microcontroller.

The aux signal may be provided to a first chain of buffers at (B). Any suitable number or kind of buffers may be used. For example, four inverters may be used. The output of the tapered buffers may be routed as slave_buf_out to circuit 510.

In parallel, the aux signal may be provided to a second chain of buffers at (C). Any suitable number or kind of buffers may be used. For example, five inverters may be used. The output of the tapered buffers may be routed as slave_buf_out_n to circuit 510.

Accordingly, the combination of the two chains of buffers may cause a trip point between 600 millivolts and 730 millivolts. Any voltage beyond this may be considered as high input.

In circuit 510, slave_buf_out_n may be routed to the gate of transistor M3. The source of M3 may be connected to a resistor, Rt, with a value of approximately 8 kiloohms. The resistor, Rt, may be connected to the output of error amplifier 502 at P1. This circuit may discharge the gate node of the NMOS driver whenever a transient voltage overshoot is sensed at Vreg_out.

In operation, at (A), the differentiator is biased at 800 mV obtained from bandgap reference voltage. This may provide a calibrated response to spikes in Vreg_out.

At (B), the first chain of tapered buffers may feed into (D). The delays may each be less than three nanoseconds. The delays may be a positive-going response of the differentiator.

At (C), the second chain of tapered buffer may feed into (E). The delays may each be less than three nanoseconds. The delays may be a negative-going response of the differentiator. The negative aspect may be due to an extra inverter at the front of the chain, compared to the first chain.

At (D), the circuit has a current source formed by PMOS transistor M1 with its gate driven by Pbias_out tapped from the error amplifier. The circuit has a capability to pump 6 milliamps when M2 is fully turned ON by the tapered buffer's output from (B). Whenever Vreg_out tries to rapidly fall, the slave_out may move up to 2.5V from its static 800 mV (VBG). This is further conditioned by (B) and made to drive M2 which in turn pumps a predetermined current into P1, the gate of NMOS driver. Thus, it may quickly correct the initial loss of voltage on Vreg_out. This action might be valid only if Vreg_out falls rapidly since the differentiator's response is null for slow moving signals. The differentiator's cut-off frequency might be, for example, 147 KHz.

At (E), the circuit has a resistor Rt along with NMOS transistor M3 that, when driven high by 'slave_buf_out_n', will discharge the gate node at P1. This circuit may activate whenever Vreg_out rapidly rises (or attempts to rise) due to sudden drop in load current demand. The differentiator's output signal slave_out may drop to approximately 300 mV from its static 800 mV (VBG) value when Vreg_out tries to overshoot rapidly. This may be further conditioned by (C) which has a unique inverter INV. INV might have a Vtrip value between 550 mV to 720 mV. The inverter chain (C) might include tapered buffers following INV. These would drive M3 in (E) which in turn discharges P1 to ground through Rt. Therefore, the gate of the NMOS driver may quickly correct the initial spike or overshoot of voltage on Vreg_out. This action might occur only if vreg_out rises rapidly since the differentiator's response is null for slow moving signals. The differentiator's cut-off frequency is 147 KHz.

Additional example values and descriptions of operation are displayed on FIGS. 5 and 6.

FIGS. 7-10 show transient response, performance, and other characteristics of the regulator, according to embodiments of the present disclosure.

Figure 8:
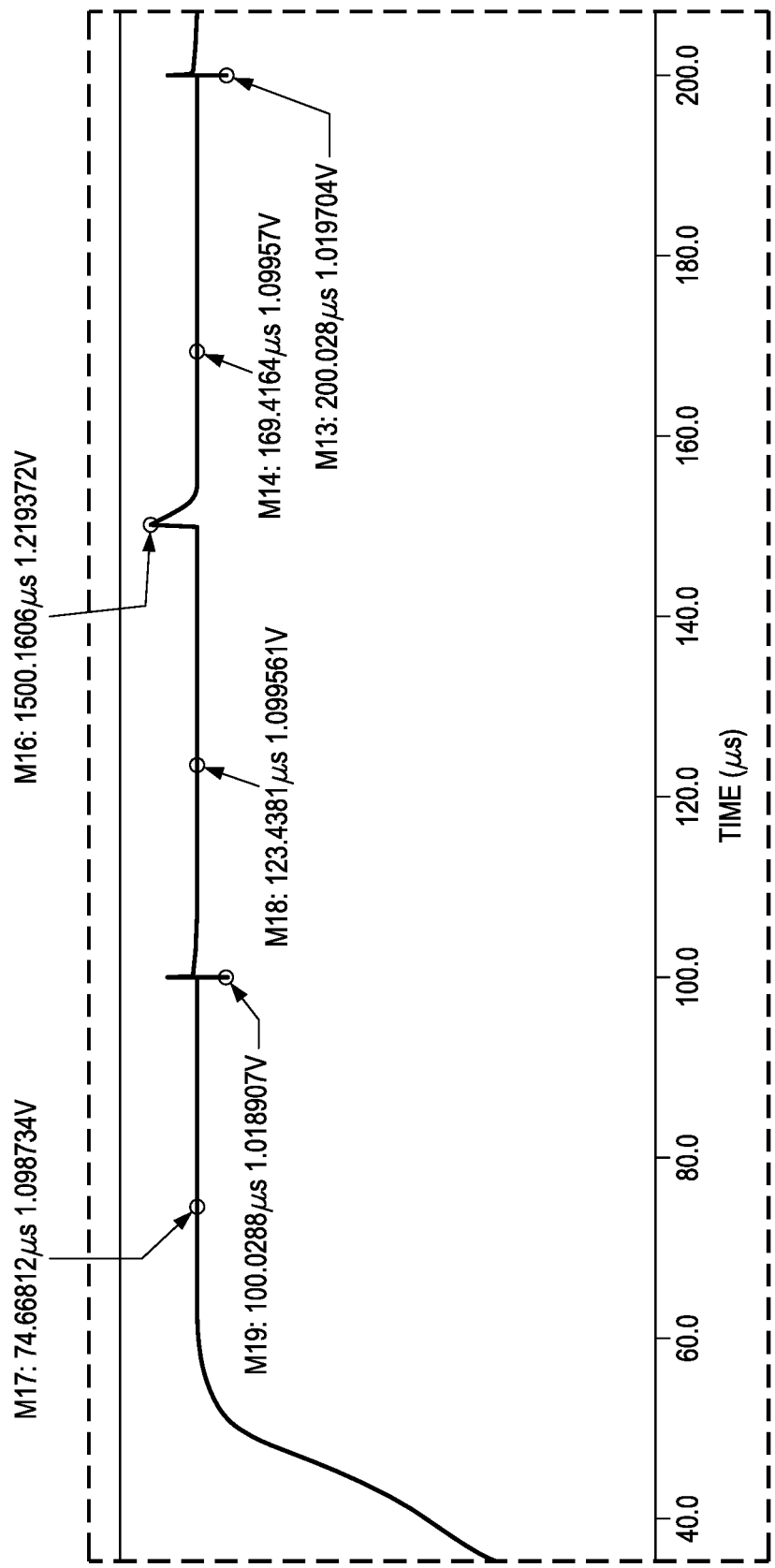

In FIG. 7, a rise and a fall in load current is met with a small spike in the output voltage of the regulator. FIG. 8 is a more detailed view of the small spikes in the output voltage shown in FIG. 7.

Figure 9:
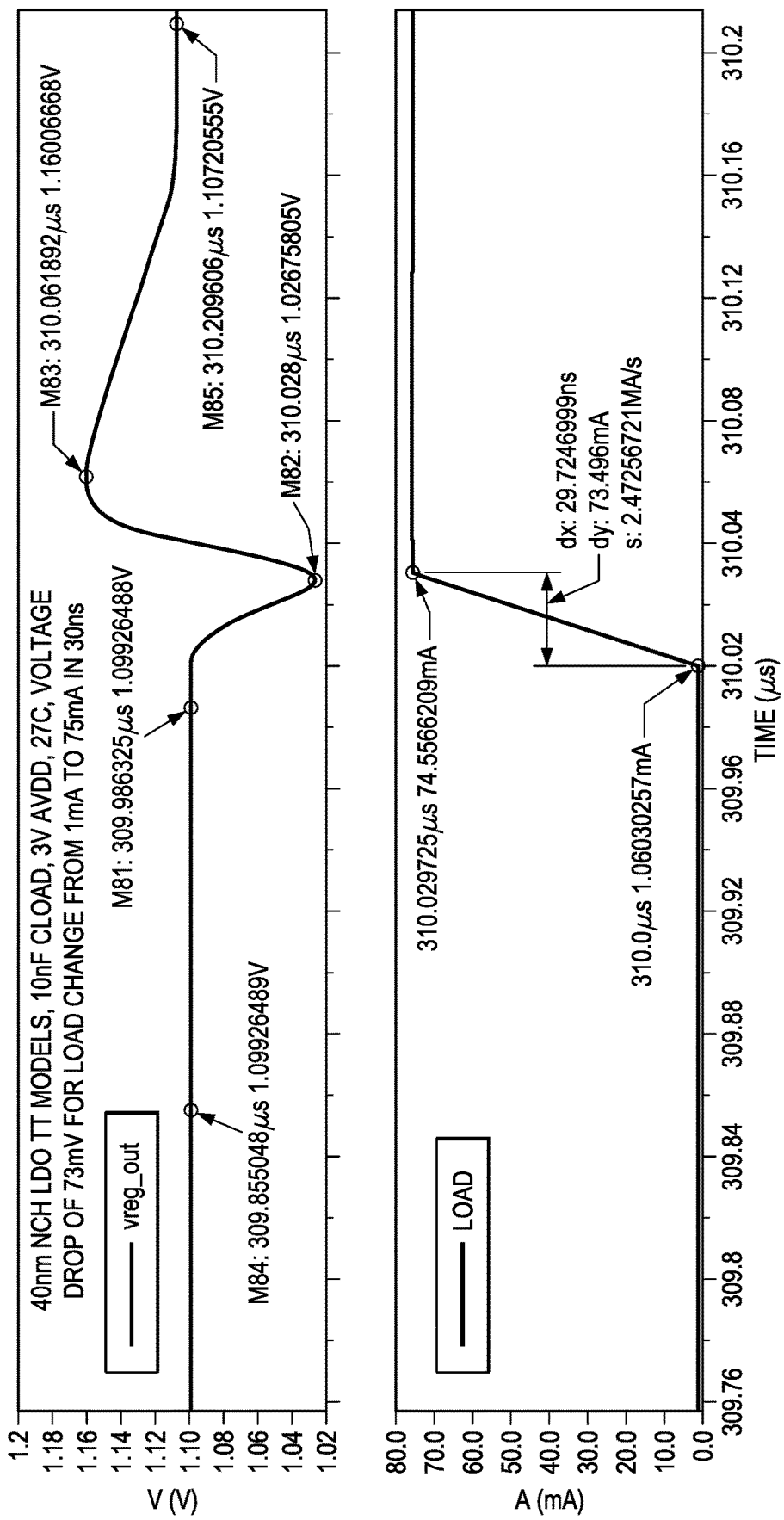
Figure 10:
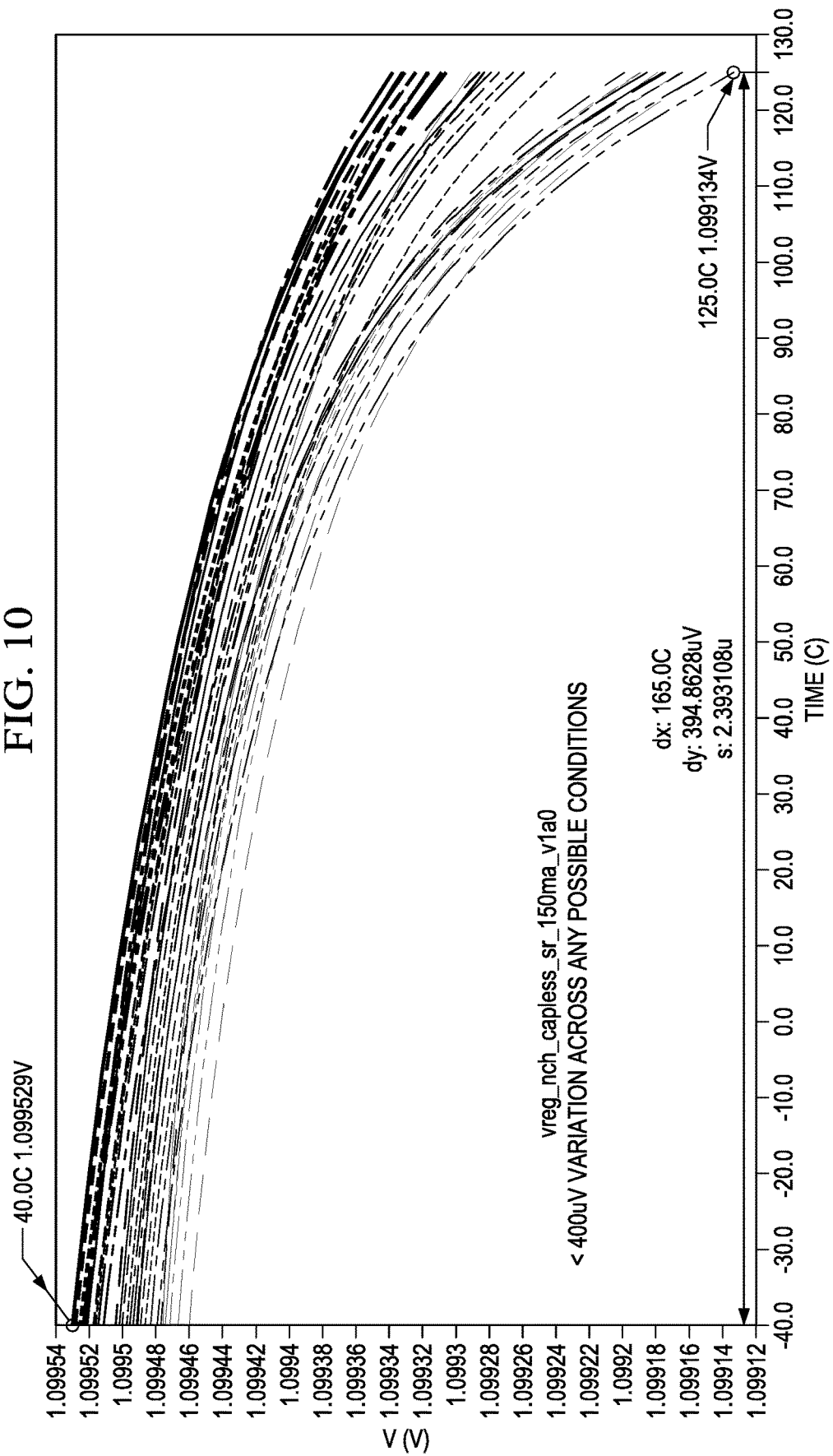

In FIG. 9, a change in load from 1 mA to 75 mA in 30 nanoseconds is applied to the regulator. The voltage response of the regulator is shown. The regulator might only encounter a small dip and overshoot in voltage as a result. FIG. 10 is a more detailed view of FIG. 8.

Other regulators such as a PMOS capless LDO driver may allow operation even with VDD3 is approximately 2 V. However, such PMOS capless LDOs may burn four times the power for the same load of capacity when compared to NMOS capless LDO drivers of the present disclosure. PMOS capless LDOs may be inherently unstable due to a dual-loop configuration, and may require a minimum on-chip capacitance of approximately 6 nanoFarads for stable operation. PMOS capless LDOs may provide poor regulation against variations in supply, load, and temperature. This may be due to a very low DC gain of approximately 40 decibels. PMOS capless LDOs may have inferior transient response in comparison to NMOS capless LDO drivers due to limitations of slew rate and less than 25 MHz bandwidth.

Embodiments of the present disclosure may include capless LDOs with stable operation. The stable operation may be due to low output impedance of the NMOS SF stage. The NMOS capless LDOs may burn ¼ the power of other systems. NMOS capless LDOs may be stable across PVT, load, power, voltage, and temperature with a load capacitor in the range of 0-50 nanoFarads. This may be due to a single loop and a single dominant pole architecture. NMOS capless LDOs may perform with very good line, load, and temperature regulation with a variation of less than 500 microvolts. This may be because of a high DC gain of 80 decibels. NMOS capless LDOs may need a minimum VDD3 of 2.5 V for guaranteed operations in all corner cases.

Embodiments of the present disclosure may include NMOS capless LDOs with a circuit with NMOS source follower for driving VDDCORE load. The unique discontinuous fast transient response circuit may generate non-overlapping antiphase clock signals for arresting overshoot and undershoot. These may be mutually exclusive to avoid any large signal oscillatory behavior. NMOS capless LDOs may provide good power management schemes of high performance motor control parts running at 200 MHz+ clock speeds. The transient response to load changes from 1 mA to 150 mA & vice-versa in just 30 ns may represent a significant performance increase.

Figure 11:
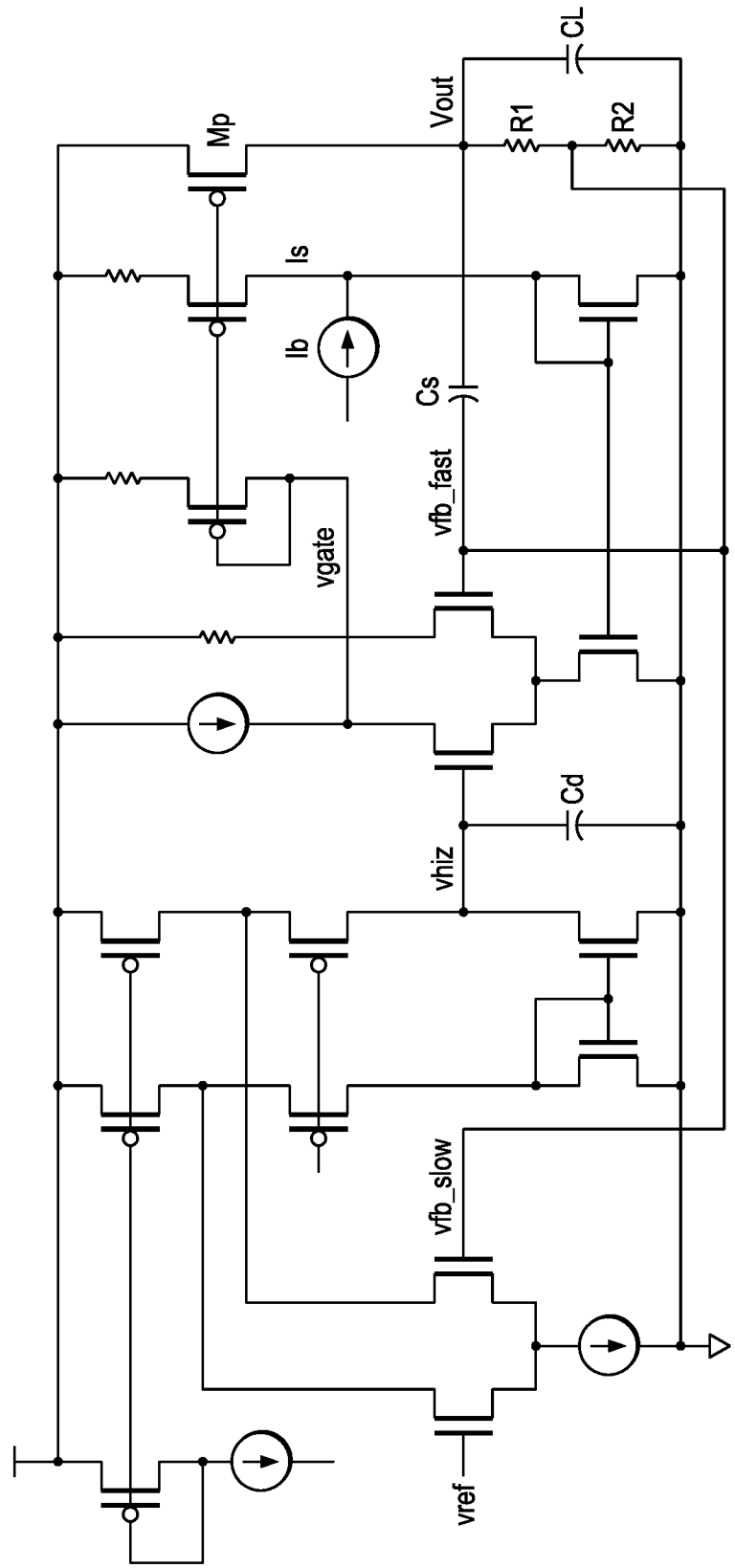
FIG. 11 may illustrate a different system upon which the present disclosure improves.

FIG. 11 may illustrate a different system upon which the present disclosure improves. This architecture deploys two error amplifiers cascaded with dual feedback loops. The frequency compensation is complex since the first error amplifier requires capacitor Cd for compensation while the second amplifier requires capacitor C1 for compensation. The slow loop stability is better if C1 is low while fast loop stability is better if C1 is large, this mutually conflicting requirements make this system inherently unstable.

Although example embodiments have been described above, other variations and embodiments may be made from this disclosure without departing from the spirit and scope of these embodiments.

The invention claimed is:

1. A voltage regulator, comprising:
a first error amplifier configured to amplify a difference between a feedback voltage and a reference voltage;
an N-type metal-oxide-semiconductor (NMOS) driver circuit, including an n-type field effect transistor, communicatively coupled to output of the first error amplifier;
a feedback circuit communicatively coupled between the NMOS driver circuit and an input of the first error amplifier to provide the feedback voltage;
a pump circuit configured to pump current into a gate node of the NMOS driver circuit, wherein an amount of the current is based upon a size of a voltage spike above the reference voltage on an output of the NMOS driver circuit;
a first delay buffer; and
a second delay buffer of a different length than the first delay buffer;
wherein:
a difference between trip voltage of the first delay buffer and the second delay buffer is configured to define a trip voltage for the voltage spike above the reference voltage;
the first delay buffer and the second delay buffer are mutually exclusive;
the first delay buffer and the second delay buffer are both configured to receive input from a same source; and
the second delay buffer is configured to drive a gate of the pump circuit to pump current into the gate node of the NMOS driver circuit.

2. The voltage regulator of claim 1, further comprising the pump circuit configured to pump current into the gate node of the NMOS driver circuit upon a transient voltage drop at the output of the NMOS driver circuit.

3. The voltage regulator of claim 1, further comprising a discharge circuit configured to discharge the gate node of the NMOS driver circuit upon a transient voltage overshoot at the output of the NMOS driver circuit.

4. The voltage regulator of claim 1, further comprising a load connected to output of the NMOS driver circuit, the output of the NMOS driver circuit configured to provide power to the load, the load without a load capacitor connected in parallel between ground and a connection between the output of the NMOS driver circuit and the load.

5. The voltage regulator of claim 1, further comprising a buffer circuit communicatively coupled to the output of the NMOS driver circuit and configured to signal to a discharge circuit configured to discharge the gate node of the NMOS driver circuit upon a transient voltage overshoot.

6. The voltage regulator of claim 5, wherein the buffer circuit includes a plurality of inverters with a trip voltage corresponding to the transient voltage overshoot.

7. The voltage regulator of claim 1, further comprising a buffer circuit communicatively coupled to the output of the NMOS driver circuit and configured to signal to the pump circuit configured to pump current into the gate node of the NMOS driver circuit upon a transient voltage drop.

8. The voltage regulator of claim 7, wherein the buffer circuit includes a plurality of inverters.

9. The voltage regulator of claim 1, further comprising the pump circuit configured to pump increased current into the gate node of the NMOS driver circuit based upon an increased load applied to the output of the NMOS driver circuit.

10. The voltage regulator of claim 1, wherein the first delay buffer and the second delay buffer each include a plurality of elements.

11. The voltage regulator of claim 1, further comprising a second error amplifier configured to receive output from the NMOS driver circuit, compare the output from the NMOS driver circuit with the reference voltage, and provide output to the first delay buffer and to the second delay buffer.

12. A microcontroller, comprising:
a first error amplifier configured to amplify a difference between a feedback voltage and a reference voltage;
an N-type metal-oxide-semiconductor (NMOS) driver circuit, including an n-type field effect transistor, communicatively coupled to output of the first error amplifier;
a feedback circuit communicatively coupled between the NMOS driver circuit and an input of the first error amplifier to provide the feedback voltage;
a pump circuit configured to pump current into a gate node of the NMOS driver circuit, wherein an amount of the current is based upon a size of a voltage spike above the reference voltage on an output of the NMOS driver circuit;
a first delay buffer; and
a second delay buffer of a different length than the first delay buffer;
wherein:
a difference between trip voltage of the first delay buffer and the second delay buffer is configured to define a trip voltage for the voltage spike above the reference voltage;
the first delay buffer and the second delay buffer both receive input from a same source; and
the second delay buffer is configured to drive a gate of the pump circuit to pump current into the gate node of the NMOS driver circuit.

13. The microcontroller of claim 12, further comprising the pump circuit configured to pump current into the gate node of the NMOS driver circuit upon a transient voltage drop at the output of the NMOS driver circuit.

14. The microcontroller of claim 12, further comprising a discharge circuit configured to discharge the gate node of the NMOS driver circuit upon a transient voltage overshoot at the output of the NMOS driver circuit.

15. The microcontroller of claim 12, further comprising a load connected to output of the NMOS driver circuit, the output of the NMOS driver circuit configured to provide power to the load, the load without a load capacitor connected in parallel between ground and a connection between the output of the NMOS driver circuit and the load.

16. The microcontroller of claim 12, further comprising a buffer circuit communicatively coupled to the output of the NMOS driver circuit and configured to signal to a discharge circuit configured to discharge the gate node of the NMOS driver circuit upon a transient voltage overshoot.

17. The microcontroller of claim 16, wherein the buffer circuit includes a plurality of inverters with a trip voltage corresponding to the transient voltage overshoot.

18. The microcontroller of claim 12, further comprising a buffer circuit communicatively coupled to the output of the NMOS driver circuit and configured to signal to the pump circuit configured to pump current into the gate node of the NMOS driver circuit upon a transient voltage drop.

19. The microcontroller of claim 18, wherein the buffer circuit includes a plurality of inverters.

20. The microcontroller of claim 12, further comprising the pump circuit configured to pump increased current into the gate node of the NMOS driver circuit based upon an increased load applied to the output of the NMOS driver circuit.

21. A method, comprising:
- through a first error amplifier, amplifying a difference between a feedback voltage and a reference voltage;
- communicatively coupling an N-type metal-oxide-semiconductor (NMOS) driver circuit, including an n-type field effect transistor, to output of the first error amplifier;
- providing a feedback circuit communicatively coupled between the NMOS driver circuit and an input of the first error amplifier to provide the feedback voltage;
- pumping current into a gate node of the NMOS driver circuit, wherein an amount of the current is based upon a size of a voltage spike above the reference voltage on an output of the NMOS driver circuit; and
- evaluating a trip voltage defined by a first delay buffer and a second delay buffer of a different length than the first delay buffer, wherein:
  - a difference between trip voltage of the first delay buffer and the second delay buffer is configured to define the trip voltage for the voltage spike above the reference voltage;
  - the first delay buffer and the second delay buffer both receive input from a same source; and
  - the second delay buffer drives a gate of the pump circuit to pump current into the gate node of the NMOS driver circuit.

* * * * *